US006709911B1

(12) United States Patent
Doczy et al.

(10) Patent No.: US 6,709,911 B1
(45) Date of Patent: Mar. 23, 2004

(54) METHOD FOR MAKING A SEMICONDUCTOR DEVICE HAVING A HIGH-K GATE DIELECTRIC

(75) Inventors: Mark L. Doczy, Beaverton, OR (US); Justin K. Brask, Portland, OR (US); John P. Barnak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/338,174

(22) Filed: Jan. 7, 2003

(51) Int. Cl.$^7$ .......................................... H01L 21/8234

(52) U.S. Cl. ...................................................... 438/197

(58) Field of Search ............................ 438/3, 197, 287, 438/240, 522, 530, 537, 586, 783, 785; 257/310

(56) References Cited

U.S. PATENT DOCUMENTS

| | | | |
|---|---|---|---|
| 5,625,217 A | 4/1997 | Chau et al. | 257/412 |
| 5,783,478 A | 7/1998 | Chau et al. | 438/592 |
| 5,880,508 A * | 3/1999 | Wu | 257/411 |
| 5,891,798 A * | 4/1999 | Doyle et al. | 438/624 |
| 6,235,594 B1 * | 5/2001 | Merchant et al. | 438/287 |
| 6,306,742 B1 * | 10/2001 | Doyle et al. | 438/591 |
| 6,312,998 B1 * | 11/2001 | Yu | 438/303 |
| 6,372,659 B1 * | 4/2002 | Yu | 438/766 |
| 6,391,727 B1 * | 5/2002 | Park | 438/287 |
| 6,617,209 B1 * | 9/2003 | Chau et al. | 438/240 |
| 2002/0098627 A1 * | 7/2002 | Pomarede et al. | 438/149 |
| 2003/0075740 A1 * | 4/2003 | Bai et al. | 257/216 |

FOREIGN PATENT DOCUMENTS

| | | | | |
|---|---|---|---|---|
| JP | 63224255 A | * | 9/1988 | H01L/29/78 |

OTHER PUBLICATIONS

Doug Barlage et al., "High–Frequency Response of 100nm Integrated CMOS Transistors with High–K Gate Dielectrics", 2001 IEEE, 4 pages.

Robert Chau et al., A 50nm Depleted–Substrate CMOS Transistor (DST), 2001 IEEE, 4 pages.

"A Method of Making a Semiconductor Device Having a High–K Gate Dielectric", Ser. No. 10/082,530, Filed Feb. 22, 2002.

"A Method of Making a Semiconductor Device Having a High–K Gate Dielectric", Ser. No. Unknown, Filed Oct. 31, 2002.

"A Method of Making a Semiconductor Device Having a High–K Gate Dielectric", Ser. No. 10/288,043, Filed Nov. 5, 2002.

Parker et al., "A Method for Making a Semiconductor Device Having a High–K Gate Dielectric", Ser. No. 10/285, 915, Filed Oct. 31, 2002.

Parker et al., "A Method for Making a Semiconductor Device Having a High–K Gate Dielectric", Ser. No. 10/315, 268, Filed Dec. 10, 2002.

(List continued on next page.)

*Primary Examiner*—W. David Coleman
*Assistant Examiner*—Brook Kebede
(74) *Attorney, Agent, or Firm*—Mark V. Seel y

(57) ABSTRACT

A method for making a semiconductor device is described. That method comprises forming a nitride based sacrificial layer on a high-k gate dielectric layer to transfer nitrogen from the nitride based sacrificial layer to the high-k gate dielectric layer to form a nitridized high-k gate dielectric layer. The remaining sacrificial layer is then removed from the nitridized high-k gate dielectric layer using a wet etch process that comprises exposing the remaining sacrificial layer to a solution that contains a non-metallic hydroxide. A gate electrode is then formed on the nitridized high-k gate dielectric layer.

17 Claims, 1 Drawing Sheet

OTHER PUBLICATIONS

Brask et al., "A Method for Making a Semiconductor Device Having a High–K Gate Dielectric", Ser. No. 10/387,303, Filed Mar. 11, 2003.

Brask et al., "A Method for Making a Semiconductor Device Having a High–K Gate Dielectric", Ser. No. 10/391,816, Filed Mar. 18, 2003.

Chau et al., "A Method for Making a Semiconductor Device Having a Metal Gate Electrode", Ser. No. 10/431,166, Filed May 6, 2003.

Brask et al., "A Method for Making a Semiconductor Device Having a High–K Gate Dielectric", Ser. No. 10/441,616, Filed May 20, 2003.

Brask et al., "A Selective Etch Process for Making a Semiconductor Device Having a High–K Gate Dielectric", Ser. No. 10/652,548, Filed Aug. 28, 2003.

* cited by examiner

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. Such a dielectric may not, however, be compatible with polysilicon—the preferred material for making the device's gate electrode.

The electron mobility on high-k films may be notably inferior to the electron mobility on silicon dioxide or silicon oxynitride films. In addition, when such a high-k film comprises an oxide, it may manifest oxygen vacancies and excess impurity levels. Oxygen vacancies may permit undesirable interaction between the high-k film and the gate electrode. When the gate electrode comprises polysilicon, such interaction may alter the electrode's workfunction or cause the device to short through the dielectric.

Accordingly, there is a need for an improved process for making a semiconductor device that includes a high-k gate dielectric. There is a need for such a process for producing a device that demonstrates acceptable electron mobility on the gate dielectric. There is a need for a process for forming a very thin high-k gate dielectric that improves the interface between the high-k film and the gate electrode by minimizing oxygen vacancies in the high-k film. The method of the present invention provides such a process.

DETAILED DESCRIPTION OF THE PRESENT INVENTION

A method for making a semiconductor device is described. That method comprises forming on a substrate a high-k gate dielectric layer, then forming a nitride based sacrificial layer on the high-k gate dielectric layer to transfer nitrogen from the nitride based sacrificial layer to the high-k gate dielectric layer to form a nitridized high-k gate dielectric layer. The remaining sacrificial layer is then removed from the nitridized high-k gate dielectric layer using a wet etch process that is selective to the nitridized high-k gate dielectric layer. That wet etch process comprises exposing the remaining sacrificial layer to a solution that contains a non-metallic hydroxide. A gate electrode is then formed on the nitridized high-k gate dielectric layer.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In an embodiment of the method of the present invention, as illustrated by FIGS. 1a–1e, high-k gate dielectric layer 101 is formed on substrate 100. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although several examples of materials from which substrate 100 may be formed are described here, any material that may serve as a foundation upon which a semiconductor device may be built falls within the spirit and scope of the present invention.

When substrate 100 comprises a silicon wafer, the wafer may be cleaned before forming high-k gate dielectric layer 101 on its surface. To clean the wafer, it may initially be exposed to a dilute hydrofluoric acid ("HF") solution, e.g., a 50:1 water to HF solution. The wafer may then be placed in a megasonic tank, and exposed first to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants.

Figure 1A:
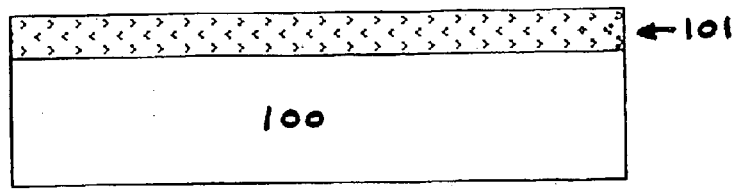
FIGS. 1a–1e represent cross-sections of structures that may be formed when carrying out an embodiment of the method of the present invention. Features shown in these figures are not intended to be drawn to scale.

After that cleaning treatment, high-k gate dielectric layer 101 may be formed on substrate 100, generating the FIG. 1a structure. High-k gate dielectric layer 101 comprises a material with a dielectric constant that is greater than the dielectric constant of silicon dioxide. Dielectric layer 101 preferably has a dielectric constant that is at least about twice that of silicon dioxide, i.e., a dielectric constant that is greater than about 8. Materials that may be used to make high-k gate dielectrics include: hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 101 are described here, that layer may be made from other materials that serve to reduce gate leakage.

High-k gate dielectric layer 101 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 101. The CVD reactor should be operated long enough to form a layer with the desired thickness. In most applications, dielectric layer 101 should be less than about 60 angstroms thick, and more preferably between about 5 angstroms and about 40 angstroms thick.

As deposited, high-k gate dielectric layer 101 may be incompatible with polysilicon. In the method of the present invention, high-k gate dielectric layer 101 is modified so that it will be compatible with polysilicon, or other materials that may be used to form the gate electrode. High-k gate dielectric layer 101 is modified by forming a nitride based sacrificial layer on its surface. The nitride based sacrificial layer comprises a material that may transfer nitrogen to high-k gate dielectric layer 101 to form a nitridized high-k gate dielectric layer. In a preferred embodiment, the nitride based sacrificial layer comprises a metal nitride. Examples of such materials include titanium nitride, tantalum nitride and aluminum nitride. A sacrificial layer that includes such a material may be formed on dielectric layer 101 using a conventional CVD or PVD process. In a preferred embodiment, such a process is used to form a sacrificial layer that comprises titanium nitride, and that is between about 10 angstroms and about 100 angstroms thick. Although a few examples of materials that may be used to form the nitride based sacrificial layer are described here, that layer may be made from other materials that serve to transfer nitrogen to high-k gate dielectric layer 101, as will be apparent to those skilled in the art.

Figure 1B:
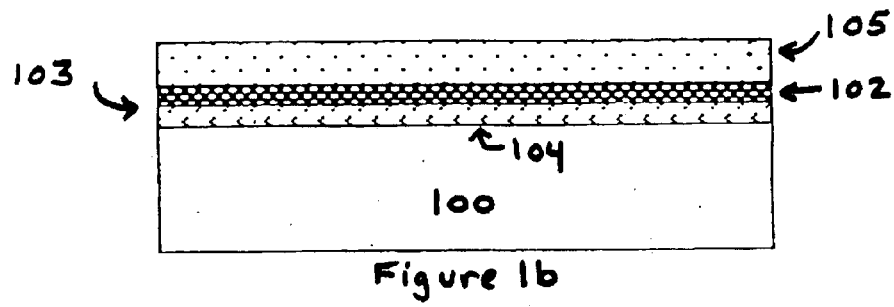

When a nitride based sacrificial layer is formed on dielectric layer 101, nitrogen migrates into the upper portion of dielectric layer 101 forming nitridized surface 102 of nitridized high-k gate dielectric layer 103—as illustrated in FIG. 1*b*. When, for example, high-k gate dielectric layer 101 comprises hafnium oxide, depositing a nitride based sacrificial layer on dielectric layer 101 may cause a ternary interface, having the molecular formula $HfN_xO_y$, to form. That interface may enhance the dielectric layer's surface properties, which may render the dielectric suitable for use with polysilicon and other gate electrode materials.

Although forming a nitride based sacrificial layer on high-k gate dielectric layer 101 may transform surface 102 into a ternary phase film (e.g., one composed of metal, nitrogen, and oxygen), that process step will not affect underlying bulk portion 104 of nitridized high-k gate dielectric layer 103. When the nitride based sacrificial layer comprises a metal nitride, the movement of nitrogen from that layer into dielectric layer 101 will leave behind a sacrificial metal. In addition to the sacrificial metal, the remaining sacrificial layer may include excess/unreacted metal nitride. For example, when the nitride based sacrificial layer comprises titanium nitride, after nitrogen migrates from the titanium nitride layer into dielectric layer 101, the remaining sacrificial layer will include titanium and any unreacted titanium nitride.

After forming the nitride based sacrificial layer on high-k gate dielectric layer 101, impurities may be transported from high-k gate dielectric layer 101 to the nitride based sacrificial layer by annealing the sacrificial layer. The nitride based sacrificial layer may be annealed using a rapid thermal anneal process or by heating that layer in a furnace at a temperature that is significantly higher than room temperature for an appropriate time period. Although applying such an annealing step, after forming the nitride based sacrificial layer, may be desirable for some applications, the method of the present invention may be practiced without adding that step to the process.

Figure 1C:
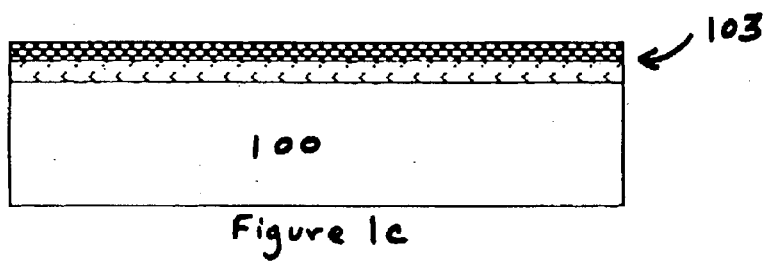
Figure 1D:
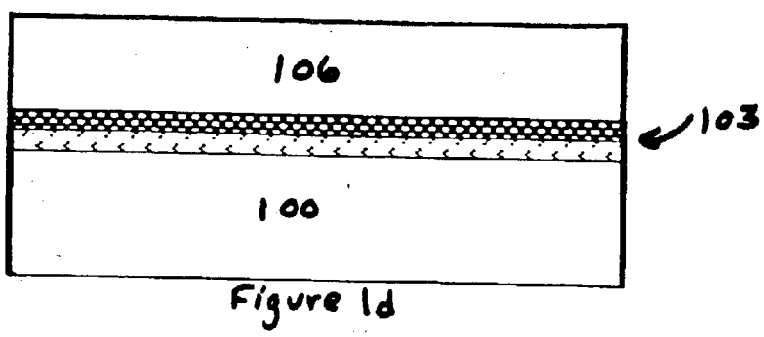
Figure 1E:
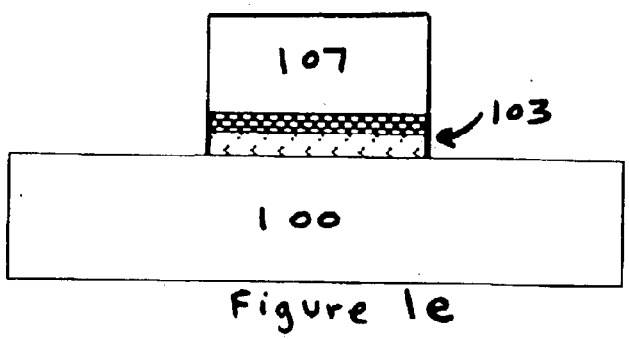

After nitrogen has moved from the nitride based sacrificial layer into dielectric layer 101, remaining sacrificial layer 105 (which may comprise residual metal and unreacted metal nitride) is removed—generating the FIG. 1*c* structure. In the method of the present invention, remaining sacrificial layer 105 is removed from nitridized high-k gate dielectric layer 103 using a wet etch process that is selective to nitridized high-k gate dielectric layer 103. That wet etch process comprises exposing remaining sacrificial layer 105 to a solution that contains a non-metallic hydroxide. The non-metallic hydroxide may comprise ammonium hydroxide or a tetraalkyl ammonium hydroxide. In a particularly preferred embodiment, the non-metallic hydroxide containing solution comprises a commercially available tetramethyl ammonium hydroxide ("TMAH") based solution.

To remove remaining sacrificial layer 105 from nitridized high-k gate dielectric layer 103, layer 105 is exposed to the non-metallic hydroxide containing solution for an appropriate time period at an appropriate temperature. For example, layer 105 may be exposed to the solution for between about 5 minutes and about 2 hours at a temperature of between about 40° C. and about 100° C. The optimum time period may depend upon the thickness of remaining sacrificial layer 105 and the desired properties for nitridized high-k gate dielectric layer 103. When a TMAH based solution is used, the solution should contain water and TMAH at a concentration that is between about 5% and about 50% by volume. In a particularly preferred embodiment, remaining sacrificial layer 105 is about 25 angstroms thick, and is removed by exposing it to a TMAH based solution (containing 25% TMAH by volume) for between about 20 minutes and about 30 minutes at a temperature of about 80° C.

Following the removal of remaining sacrificial layer 105, a gate electrode may be formed on nitridized high-k gate dielectric layer 103. In a preferred embodiment, the gate electrode may be formed by initially depositing polysilicon layer 106 on nitridized high-k gate dielectric layer 103—generating the FIG. 1*d* structure. Polysilicon layer 106 may be deposited using conventional methods and preferably is between about 500 angstroms and about 4,000 angstroms thick. After etching both layers 106 and 103 to form the FIG. 1*e* structure, using conventional techniques, additional steps that are generally used to complete the gate electrode (e.g., forming a silicide (not shown) on the upper part of etched polysilicon structure 107) may be applied. As such steps are well known to those skilled in the art, they will not be described in more detail here. Although the gate electrode preferably comprises polysilicon, it may alternatively be formed from various metals with which the above described high-k gate dielectrics may be used.

The method of the present invention may enable a high-k gate dielectric to be used with a polysilicon-based gate electrode. Forming a nitride based sacrificial layer on a high-k gate dielectric layer will cause nitrogen to migrate into the dielectric layer, which may improve that layer's surface properties—e.g., by ensuring acceptable electron mobility on the dielectric layer and by helping to maintain a sufficient oxygen to metal ratio to prevent formation of oxygen vacancies that may alter the gate electrode's workfunction.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

forming a high-k gate dielectric layer on a substrate;

forming a nitride based sacrificial layer on the high-k gate dielectric layer to transfer nitrogen from the nitride based sacrificial layer to the high-k gate dielectric layer to form a nitridized high-k gate dielectric layer;

removing the remaining sacrificial layer from the nitridized high-k gate dielectric layer using a wet etch process that is selective to the nitridized high-k gate dielectric layer, the wet etch process comprising exposing the remaining sacrificial layer to a solution that contains tetramethyl ammonium hydroxide; and then forming a gate electrode on the nitridized high-k gate dielectric layer.

2. The method of claim 1 wherein the nitride based sacrificial layer comprises a metal nitride.

3. The method of claim 2 wherein the nitride based sacrificial layer comprises titanium nitride.

4. The method of claim 3 wherein the high-k gate dielectric layer is formed by atomic layer chemical vapor deposition, and wherein the high-k gate dielectric layer comprises a material selected from the group consisting of hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

5. The method of claim 1 wherein the remaining sacrificial layer is exposed to the tetramethyl ammonium hydroxide containing solution for at least about 5 minutes at a temperature of at least about 40° C.

6. The method of claim 5 wherein the gate electrode comprises polysilicon.

7. A method for making a semiconductor device comprising:
    forming a high-k gate dielectric layer on a substrate;
    forming a sacrificial layer that comprises titanium nitride on the high-k gate dielectric layer to transfer nitrogen from the sacrificial layer to the high-k gate dielectric layer to form a nitridized high-k gate dielectric layer, the remaining sacrificial layer comprising titanium;
    removing the remaining sacrificial layer from the nitridized high-k gate dielectric layer using a wet etch process that is selective to the nitridized high-k gate dielectric layer, the wet etch process comprising exposing the remaining sacrificial layer to a solution that contains tetramethyl ammonium hydroxide; and then
    forming a layer that comprises polysilicon on the nitridized high-k gate dielectric layer.

8. The method of claim 7 wherein the remaining sacrficial layer comprises unreacted titanium nitride.

9. The method of claim 8 wherein the substrate comprises silicon.

10. The method of claim 9 wherein the high-k gate dielectric layer is formed by atomic layer chemical vapor deposition, and is between about 5 angstroms and about 40 angstroms thick.

11. The method of claim 10 wherein the high-k gate dielectric layer comprises a material selected from the group consisting of hafnium oxide, zirconium oxide, titanium oxide, and aluminum oxide.

12. The method of claim 11 wherein the sacrificial layer is between about 10 angstroms and about 100 angstroms thick.

13. The method of claim 12 wherein the sacrificial layer is annealed after it is formed on the high-k gate dielectric layer.

14. The method of claim 7 wherein the layer that comprises polysilicon is between about 500 angstroms and about 4,000 angstroms thick.

15. A method for making a semiconductor device comprising:
    forming a high-k gate dielectric layer on a substrate, the high-k gate dielectric layer being less than about 60 angstroms thick and comprising a material selected from the group consisting of hafnium oxide, zirconium oxide, titanium oxide, and aluminum oxide;
    forming a titanium nitride layer that is between about 10 angstroms and about 100 angstroms thick on the high-k gate dielectric layer to transfer nitrogen from the titanium nitride layer to the high-k gate dielectric layer to form a nitridized high-k gate dielectric layer, and to form on the nitridized high-k gate dielectric layer a sacrificial layer that comprises titanium and unreacted titanium nitride; then
    removing the sacrificial layer from the nitridized high-k gate dielectric layer using a wet etch process that is selective to the nitridized high-k gate dielectric layer, the wet etch process comprising exposing the sacrificial layer to a solution that contains tetramethyl ammonium hydroxide;
    forming a layer that comprises polysilicon on the nitridized high-k gate dielectric layer; and
    etching the polysilicon containing layer and the nitridized high-k gate dielectric layer.

16. The method of claim 15 wherein the high-k gate dielectric layer is formed by atomic layer chemical vapor deposition and is between about 5 angstroms and about 40 angstroms thick.

17. The method of claim 15 wherein the layer that comprises polysilicon is between about 500 angstroms and about 4,000 angstroms thick.

* * * * *